(12) United States Patent
Zhang et al.

(10) Patent No.: US 11,714,449 B2
(45) Date of Patent: Aug. 1, 2023

(54) HIGH-SPEED DESERIALIZER WITH PROGRAMMABLE AND TIMING ROBUST DATA SLIP FUNCTION

(71) Applicant: International Business Machines Corporation, Armonk, NY (US)

(72) Inventors: Ze Zhang, Austin, TX (US); Dereje Yilma, Rochester, MN (US); Chad Andrew Marquart, Austin, TX (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 17/485,559

(22) Filed: Sep. 27, 2021

(65) Prior Publication Data

US 2023/0099810 A1    Mar. 30, 2023

(51) Int. Cl.
*G06F 1/06*       (2006.01)
*G06F 13/36*   (2006.01)

(52) U.S. Cl.
CPC ............... *G06F 1/06* (2013.01); *G06F 13/36* (2013.01)

(58) Field of Classification Search
CPC .................................. G06F 1/06; G06F 13/26
USPC ......................................................... 713/501
See application file for complete search history.

(56) References Cited

U.S. PATENT DOCUMENTS 3,902,161 A * 8/1975 Kiowski ................ G08C 19/28
    367/76
3,909,541 A * 9/1975 Bobilin .................... H04L 25/14
    370/514
5,262,943 A * 11/1993 Thibado ................. G16H 10/60
    128/923
5,339,432 A * 8/1994 Crick ..................... G06F 9/4411
    713/1
5,666,547 A * 9/1997 James ....................... G06F 7/02
    710/58

(Continued)

FOREIGN PATENT DOCUMENTS

WO    2010136995 A1    12/2010
WO    2011094211 A2    8/2011

OTHER PUBLICATIONS

Arria II Device Handbook vol. 1, Chapter 8: High-Speed Differential I/O Interfaces and DPA in Arria II Devices, Device Interfaces and Integration, Jul. 2012, 38 pages.

(Continued)

*Primary Examiner* — Paul R. Myers
(74) *Attorney, Agent, or Firm* — Cantor Colburn LLP; Jeffrey Ingalls (57) ABSTRACT

Provided are embodiments for operating a high-speed deserializer. Embodiments can include receiving a clock slip signal to enable operation of the slip pulse generation circuit, and generating a slip pulse signal using the slip pulse-controlled clock generation circuit, wherein the slip pulse signal is programmable to slip one or more bits of a serial input data. Embodiments can also include generating a plurality of deserialization clocks for sampling the serial input data using the slip pulse-controlled clock generation circuit, wherein the plurality of deserialization clocks are generated simultaneously with each other, and providing the plurality of deserialization clocks to the deserializer to selectively sample the serial input data.

18 Claims, 7 Drawing Sheets

100

(56) References Cited

U.S. PATENT DOCUMENTS

| | | | | |
|---|---|---|---|---|
| 6,081,570 | A * | 6/2000 | Ghuman | H04J 3/0605 370/514 |
| 6,141,636 | A * | 10/2000 | Sarno | G06F 11/261 714/E11.155 |
| 6,204,687 | B1 * | 3/2001 | Schultz | G06F 30/34 326/38 |
| 6,594,308 | B1 * | 7/2003 | Galbiati | G06F 1/025 375/238 |
| 6,617,893 | B1 | 9/2003 | Born et al. | |
| 6,970,115 | B1 | 11/2005 | Sardi et al. | |
| 7,046,174 | B1 | 5/2006 | Lui et al. | |
| 7,113,009 | B2 | 9/2006 | Sun et al. | |
| 7,372,928 | B1 * | 5/2008 | Foley | H04J 3/0685 375/354 |
| 7,409,616 | B1 * | 8/2008 | Sardi | G01R 31/31715 714/736 |
| 7,440,532 | B1 | 10/2008 | Chang | |
| 7,936,854 | B2 | 5/2011 | Foley et al. | |
| 8,648,636 | B2 | 2/2014 | Johnson et al. | |
| 8,774,305 | B1 | 7/2014 | Chang | |
| 8,817,855 | B2 | 8/2014 | Asmanis et al. | |
| 2001/0011261 | A1 * | 8/2001 | Mullen-Schultz | G06F 16/9577 |
| 2001/0034728 | A1 * | 10/2001 | McBride | G06F 11/1464 |
| 2002/0157021 | A1 * | 10/2002 | Sorkin | H04L 63/1408 726/4 |
| 2007/0258491 | A1 * | 11/2007 | Reitlingshoefer | H04L 7/033 370/535 |
| 2008/0192871 | A1 * | 8/2008 | Foley | H04J 3/0685 375/354 |
| 2009/0074407 | A1 | 3/2009 | Hornbuckle et al. | |
| 2011/0191619 | A1 * | 8/2011 | Morrison | H04L 25/14 713/500 |
| 2012/0072785 | A1 * | 3/2012 | Ding | H04L 1/203 714/704 |
| 2021/0247722 | A1 * | 8/2021 | Cohen | H03M 1/504 |

OTHER PUBLICATIONS

Hwang, H. & Kim, J., A 100 GB/s Quad-Lane SerDes Receiver with a PI-Based Quarter-Rate All-Digital CDR, Electronics 2020, vol. 9, No. 1113, pp. 1-16.

Intel® Stratix® 10 High-Speed LVDS I/O User Guide, Updated for Intel® Quartus® Prime Design Suite: 20.3, UG-S10LVDS, Nov. 13, 2020, 74 pages.

* cited by examiner

HIGH-SPEED DESERIALIZER WITH PROGRAMMABLE AND TIMING ROBUST DATA SLIP FUNCTION

BACKGROUND

The present invention generally relates to a deserializer, and more specifically, to a high-speed deserializer with a programmable and timing robust data slip function.

In today's computer systems, data is usually transported in a parallel format along a digital data path that is "N" bits wide to accommodate a discrete piece of information or data termed a "byte" or a "word." In most computer systems, N is typically an integer multiple of eight. The parallel format of the data allows multiple data bits to be transmitted simultaneously over the internal data path of the computer, thereby increasing the speed with which information is transferred from one place to another. As computer communication becomes increasingly widespread, it will become even more critical to develop efficient techniques for transmitting high-speed serial data signals from one location to another.

SUMMARY

Embodiments of the present invention are directed to a high-speed deserializer with programmable and timing robust data slip function. A non-limiting example method includes receiving a clock slip signal to enable operation of the slip pulse generation circuit, and generating a slip pulse signal using the slip pulse-controlled clock generation circuit, wherein the slip pulse signal is programmable to slip one or more bits of a serial input data. The method can also include generating a plurality of deserialization clocks for sampling the serial input data using the slip pulse-controlled clock generation circuit, wherein the plurality of deserialization clocks are generated simultaneously with each other, and providing the plurality of deserialization clocks to the deserializer to selectively sample the serial input data.

Other embodiments of the present invention implement features of the above-described method in systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a high-speed deserializer that includes a slip pulse generation circuit. The slip pulse generation circuit is used to generate a slip pulse signal. The slip pulse signal is used to generate and delay a plurality of deserialization clocks that are used by the deserializer to sample the incoming serial data. The slip pulse signal can be programmed by a user input to slip one or more bits. The width of the slip pulse signal corresponds to the number of bits to be slipped. The slip pulse signal delays the sampling edge of the deserialization clocks which results in the slipping of a number of bits. In addition, the architecture of the slip pulse generation circuit enables robust timing to provide reliable deserialization of the received serial data.

The techniques described herein address the inflexibility of the existing prior art to slip any number of bits and also address timing issues introduced in existing systems. Most systems require a plurality of control inputs and only slip a fixed number of bits. Embodiments of the present invention utilize a limited number of control signals and utilize a single critical timing point for the high-speed deserialization system to eliminate any opportunities for clock glitch.

One or more embodiments of the present invention address one or more of the above-described shortcomings of the prior art by providing a slip pulse generation circuit to slip a programmable number of bits, which is in contrast to conventional systems which are designed to slip a single bit or a fixed number of bits. In addition, conventional systems also include a plurality of timing circuits which can introduce multiple opportunities to lose the synchronization between the deserialization clocks. Because embodiments of the invention use a single timing critical circuit which is used to generate the other clocks, synchronization of the clocks is robust and no additional delay is introduced.

Figure 1:
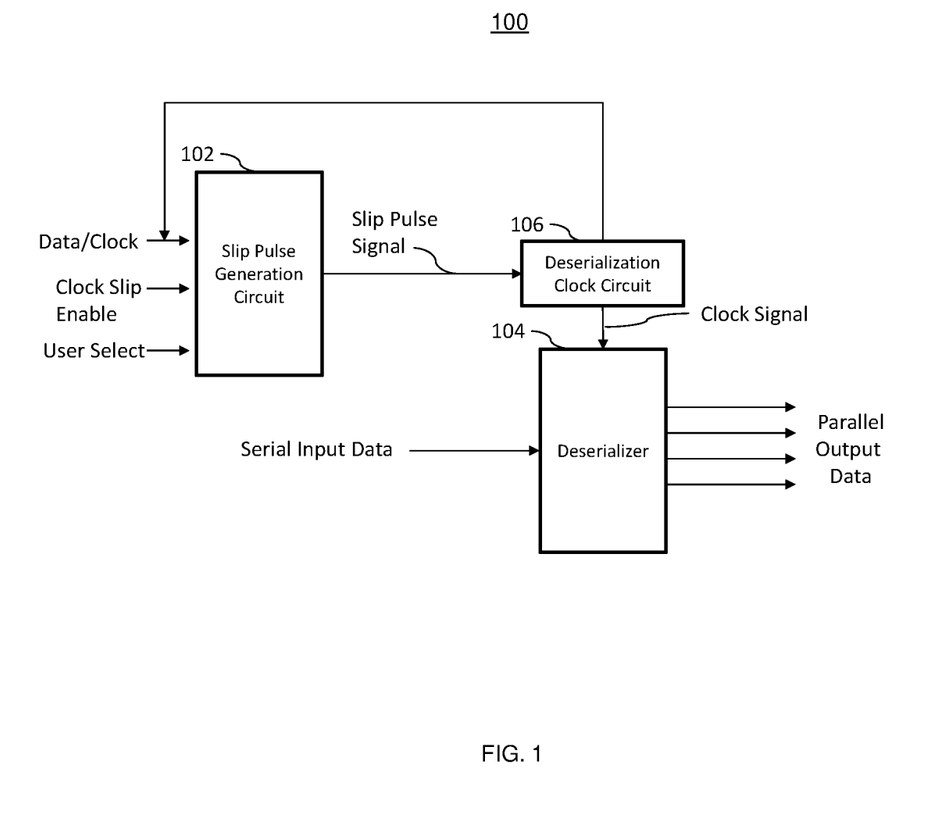
FIG. 1 illustrates a block diagram of a high-speed deserializer in accordance with one or more embodiments of the invention.

Turning now to FIG. 1, a block diagram of a high-speed deserializer system 100 is generally shown in accordance with one or more embodiments of the present invention. FIG. 1 depicts components of the high-speed deserializer system 100 including a slip pulse generation circuit 102, the deserializer 104, and a deserialization clock circuit 106. The slip pulse generation circuit 102 is configured to receive a user input signal, a clock slip enable signal, and a clock signal to generate a slip pulse signal that is provided to the deserialization clock circuit 106. The slip pulse signal is used to simultaneously generate a plurality of deserialization clock signals that is used by the deserializer to sample the serial input data. A user input determines the width of the slip pulse signal which can be programmed to slip 1 to N bits, wherein N is any number. In addition, the slip pulse generation circuit 102 provides the slip pulse signal to the deserialization clock circuit at the appropriate time to maintain the word or frame alignment among the serial input data. Further details of the slip pulse generation circuit 102 are discussed with reference to FIG. 2.

The deserializer 104 which is a demultiplexer is configured to receive a serial input data stream and output a plurality of parallel data streams from the received serial input data. The deserializer 104 extracts the bits to form the words (frames) from the serial input data using a clock to sample the bits at the proper locations of the stream. If the bits are not sampled at the proper locations or a bit is added or missing, an error can occur due to not obtaining the proper word from the serial input data.

The deserialization clock circuit 106 is a clock divider circuit that includes multiple clock dividing stages. Each subsequent stage of the deserialization clock circuit 106 is driven from clocks generated by the received slip pulse signal. The slip pulse signal is used to synchronously delay or advance the multiple clocks by the same amount. Therefore, the multiple clocks that are generated by the deserialization clock circuit 106 maintain strict timing and no erroneous sampling opportunities are introduced. The plurality of generated clock signals is provided to the deserializer 104. The details of the clock divider circuit 106 are discussed with references to FIG. 4.

Figure 2:
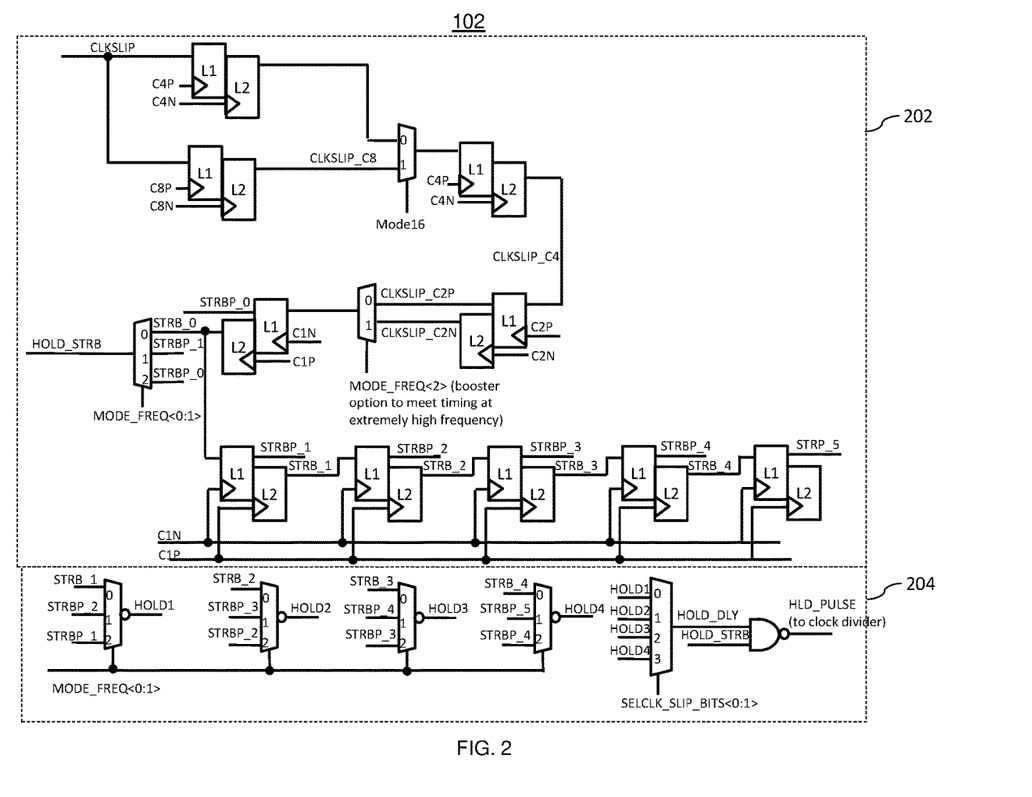
FIG. 2 illustrates components of a slip pulse generation circuit of a high-speed deserializer in accordance with one or more embodiments of the invention.

FIG. 2 illustrates components of a slip pulse generation circuit 102 of a high-speed deserializer in accordance with one or more embodiments of the invention. The slip pulse generation circuit 102 includes a timing circuit 202 and a pulse width determination circuit 204. The timing circuit 202 is used to detect the timing of the clock signals of the deserializer 104 and maintain the synchronization when the slip pulse signal should be provided. The timing circuit 202 begins when a clock slip signal (CLKSLIP) is received. The timing circuit 202 includes a number of latches L1, L2.

The pulse width determination circuit 204 is configured to receive a user signal (SELCLK_SLIP_BITS) at the multiplexor to programmably slip the one or more bits at the deserializer 104. The number of bits to slip is directly correlated to the width of the generated slip pulse signal. The output of the slip pulse generation circuit 102 generates the slip pulse signal (also referred to as a hold pulse signal) to be provided to the clock deserialization circuit 106.

Figure 3:
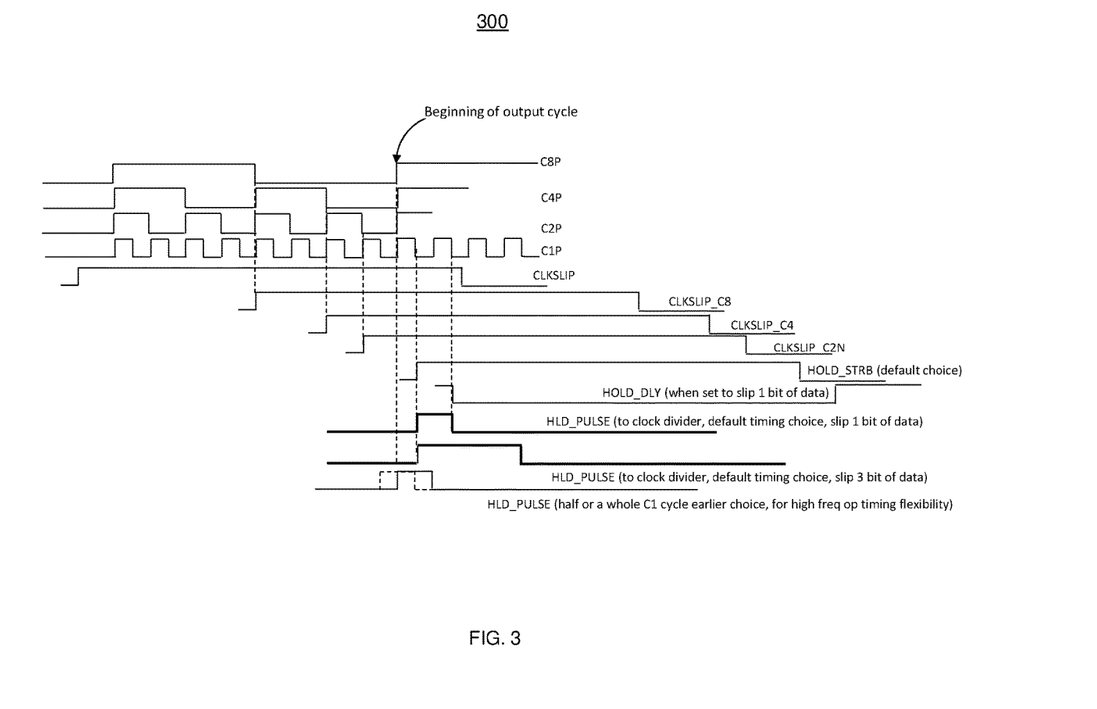
FIG. 3 illustrates waveforms representing the operation of the slip pulse generation of a high-speed deserializer in accordance with one or more embodiment of the invention.

FIG. 3 illustrates a timing diagram 300 including waveforms representing the operation of the slip pulse generation of a high-speed deserializer in accordance with one or more embodiment of the invention. As shown in FIG. 3, the CLKSLIP signal initiates the operation of the slip pulse generation circuit 102. Although only the C1P signal is shown, it should be understood that C1P is associated with complementary (inverse) signals. In one or more embodiments of the invention, the C1P signal is the same rate as the data rate of the serial input data stream. After the slip generation operation is initiated, the longest cycle clock is determined. The longest clock signal C8 is shown. Clock signal C8 is half the rate of clock signal C4, the clock signal C4 is half the rate of clock signal C2, and the clock signal C2 is half the rate of clock signal C1. In one or more embodiments of the present invention, C2P/C2N, C4P/C4N, C8P/C8N come from the deserialization clock divider 106, and hence have the same cycle as the corresponding clocks used to sample data in the deserializer 104. The clock signals C1P, C2P, C4P, and C8P are used by the timing circuit 202 to synchronize the bit slipping operation with the deserializer 104. As shown in FIG. 3, each of the timed CLKSLIP signals (CLKSLIP_C8, CLKSLIP_C4, CLKSLIP_C2N) are launched at the strategic cycle partition point, so that the final HOLD STRB signal can be timed to arrive at the beginning of the next word cycle.

Figure 4:
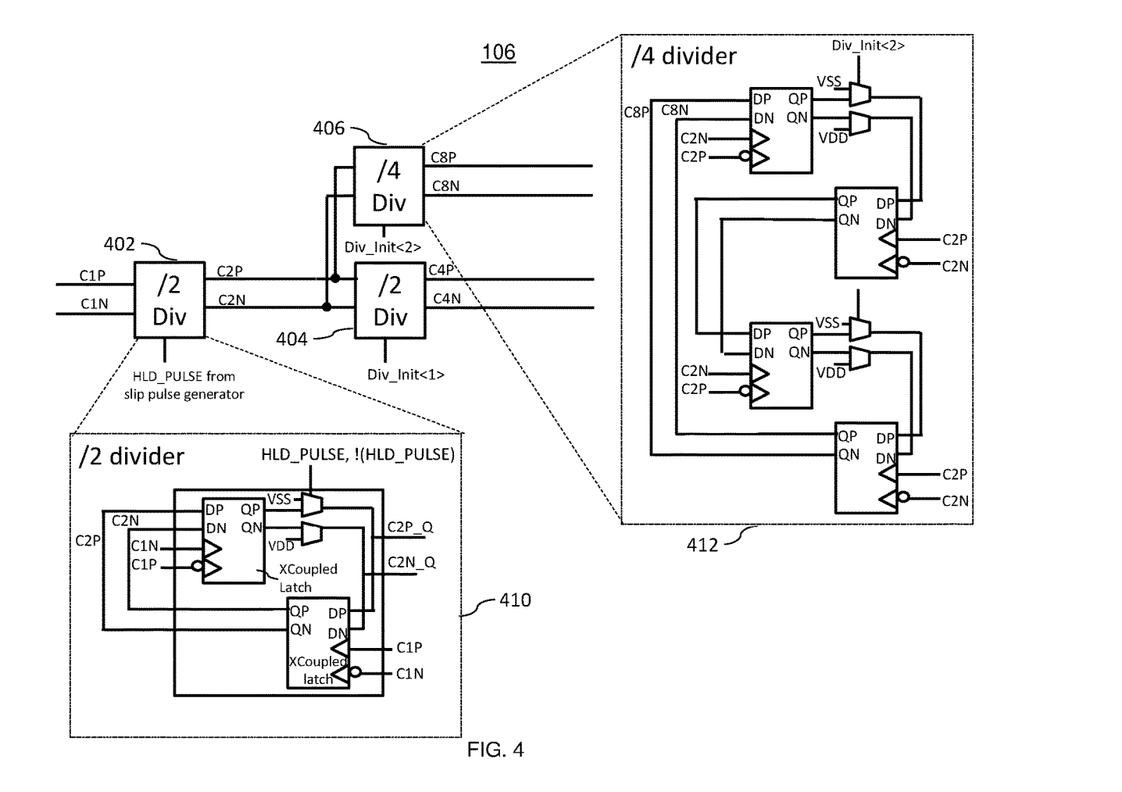
FIG. 4 illustrates an example clock divider circuit of the high-speed deserializer in accordance with one or more embodiments of the invention.

FIG. 4 illustrates an example deserialization clock circuit 106 of the high-speed deserializer in accordance with one or more embodiments of the invention. The deserialization clock circuit 106 provides an improvement over existing deserializers because the slip pulse signal (HLD_PULSE) is used to generate each of the multiple clocks used by the deserializer 104. An arrangement of the deserialization clock circuit 106 includes a first clock divider circuit 402 that receives the slip pulse signal from the slip pulse generation circuit and receives the C1P and C1N signals. The output of the first clock divider circuit 402 is half the rate of the input (½ wave clock rate) to the first clock divider circuit 402 and is provided as inputs to the second clock divider circuit 404 and third clock divider circuit 406. As shown, the second clock divider circuit is half the rate of its input (¼ wave clock rate) and the third clock divider circuit 406 is a quarter of the rate of its input (½ wave clock rate).

Further details of the first and second clock divider circuits 402, 404 are shown in block 410. As shown, a combination of latches receives the inputs clocks C1P and C1N to generate the output clocks C2P and C2N. The output clocks are used by the deserializer 104. Further details of the third clock divider circuits 406 are shown in block 412, which illustrates an arrangement of latches to achieve the desired output clock. It should be understood that the number of additional clock divider circuits can be added while simultaneously maintaining the robust timing of the deserializer 104.

The architecture of the deserialization clock circuit 106 synchronously delays each of the deserialization clocks and provides a timing robust solution to minimize and/or eliminate opportunities for clock glitching since each clock is derived directly from the initial divided clocks C2P, C2N.

Figure 5:
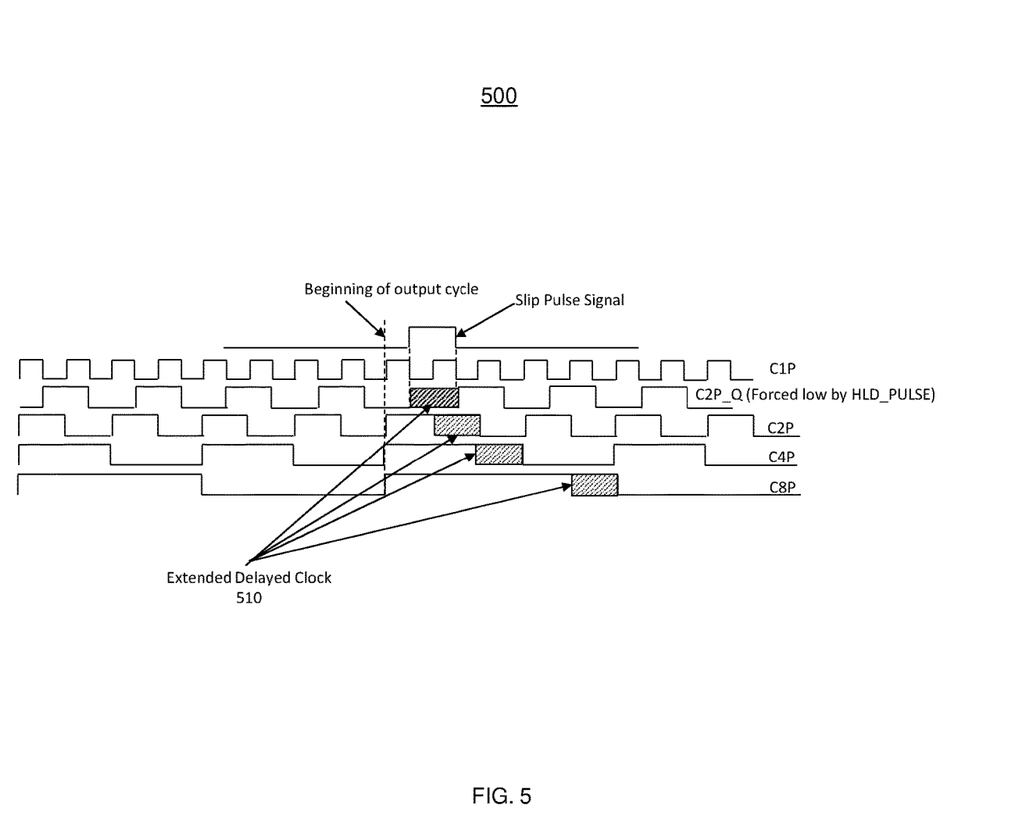
FIG. 5 illustrates waveforms of the clock divider circuit of the high-speed deserializer in accordance with one or more embodiments of the invention.

FIG. 5 illustrates a timing diagram 500 of waveforms of the clock divider circuit 106 of the high-speed deserializer in accordance with one or more embodiments of the invention. The timing diagram 500 illustrates an example "delayed" clock for each of the clocks based on the slip pulse signal (HLD_PULSE signal). Each of the sampling clock edges for clocks C2P, C4P, and C8P are delayed or extended by the same amount based on the slip pulse signal generated by the slip pulse generation circuit 102 of the architecture provided in FIG. 2. The width of the slip pulse signal, in this example, corresponds to the delay and actively extends each of the sampling edges of the deserializer 104 by the same pulse width 510, represented by the patterned region. In one or more embodiments of current invention, complimentary clocks C2N, C4N and C8N are generated but not drawn out here. The complimentary clock waveforms are strictly synchronized at each rising or falling edges. Since each of the clocks C2P, C4P, and C8P are simultaneously generated and delayed by the same amount, the synchronization among the clocks of different sampling rates is maintained. Each of the sampling clocks are extended by the same amount, where the delayed sampling edge represents slipping (not sampling) a corresponding number of bits in the received serial data. Therefore, the skipped corresponding bit(s) of the serial input data is not seen in the next cycle. Also, it should be noted, clocks C4P/C4N, C8P/C8N are retimed by C1P/C1N to synchronize with C2P/C2N although the details are omitted in FIG. 5.

Figure 6:
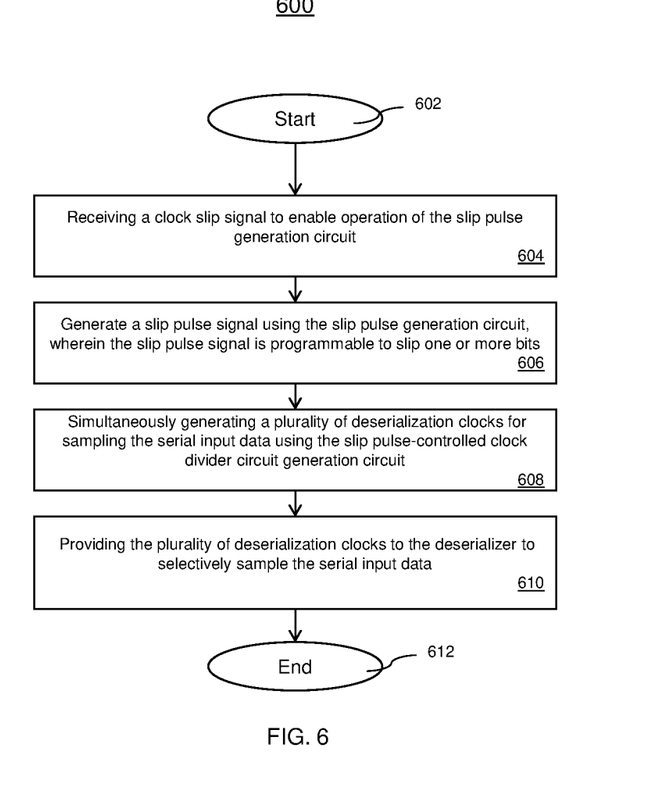
FIG. 6 illustrates a flowchart of a method for operating a high-speed deserializer with programmable and timing robust data slip function in accordance with one or more embodiments of the invention.

FIG. 6 illustrates a flowchart of a method for operating a high-speed deserializer with a programmable and timing robust data slip function in accordance with one or more embodiments of the invention. The method 600 can be implemented in the system 100 shown in reference to FIG. 1. The method 600 begins at block 602 and proceeds to block 604 which provides for receiving, at a slip pulse generation circuit, a clock slip signal to enable operation of the slip pulse generation circuit. Block 606 generates a slip pulse signal using the slip pulse generation circuit, wherein the slip pulse signal is programmable to slip one or more bits. In one or more embodiments of the invention, a user input is received to programmably select a number of bits to slip in the next cycle. Block 608 simultaneously generates a plurality of deserialization clocks for sampling the serial input data using the slip pulse-controlled clock generation circuit. In some embodiments of the invention, the plurality of deserialization clocks include generating a ½ wave clock, a ¼ wave clock, and a ½ wave clock. Block 610 provides the plurality of deserialization clocks to the deserializer to selectively sample the serial input data. In embodiments of the invention, the slipping of one or more bits of the output word frame by timing the slip pulse signal with the plurality of deserialization clocks. In other embodiments, the slip pulse signal shifts the deserialization clocks a half or a whole input data cycle earlier in a subsequent cycle. The method 600 ends at block 612.

The techniques described herein improve over the prior art by providing an architecture for slip pulse generation circuit that is programmable from one-to-many bits. In addition, the architecture for the high-speed deserializer system provides a timing robust mechanism for slipping a configurable number of bits at the correct part of the serial stream.

The technical aspects of the invention do not require a shift register or multiple timing circuits that require a plurality of different control signals. In the architecture of one or more embodiments of the invention, bit slipping occurs at the same time as the deserialization. The techniques described herein reduce the over receiver operation latency. In addition, the techniques described herein are compatible with any deserialization demultiplexer (DMUX) design supporting rates from 1-60 gigabits per second (Gbps).

Figure 7:
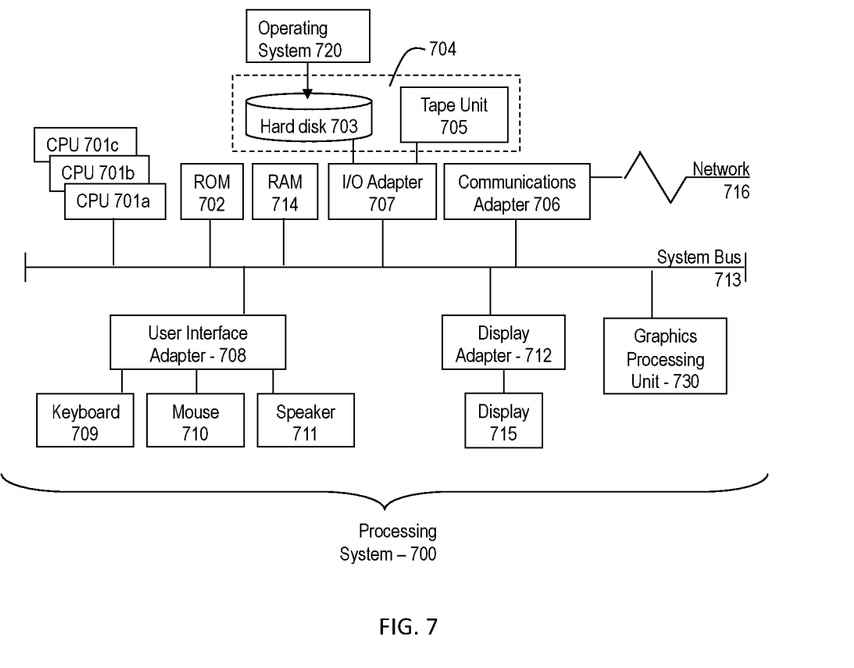
FIG. 7 depicts a generic system for practicing the teachings herein in accordance with one or more embodiments of the invention.

FIG. 7 depicts a generic system for practicing the teachings herein in accordance with one or more embodiments of the invention. Referring to FIG. 7, there is shown an embodiment of a processing system 700 for implementing the teachings herein. In this embodiment, the system 700 has one or more central processing units (processors) 701a, 701b, 701c, etc. (collectively or generically referred to as processor(s) 701). In one embodiment, each processor 701 may include a reduced instruction set computer (RISC) microprocessor. Processors 701 are coupled to system memory 714 and various other components via a system bus 713. Read only memory (ROM) 702 is coupled to the system bus 713 and may include a basic input/output system (BIOS), which controls certain basic functions of system 700.

FIG. 7 further depicts an input/output (I/O) adapter 707 and a network adapter 706 coupled to the system bus 713. I/O adapter 707 may be a small computer system interface (SCSI) adapter that communicates with a hard disk 703 and/or tape storage drive 705 or any other similar component. I/O adapter 707, hard disk 703, and tape storage device 705 are collectively referred to herein as mass storage 704. Operating system 720 for execution on the processing system 700 may be stored in mass storage 704. A network adapter 706 interconnects bus 713 with an outside network 716 enabling data processing system 700 to communicate with other such systems. A screen (e.g., a display monitor) 715 is connected to system bus 713 by display adaptor 712, which may include a graphics adapter to improve the performance of graphics intensive applications and a video controller. In one embodiment, adapters 707, 706, and 712 may be connected to one or more I/O busses that are connected to system bus 713 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 713 via user interface adapter 708 and display adapter 712. A keyboard 709, mouse 710, and speaker 711 all interconnected to bus 713 via user interface adapter 708, which may include, for example, a Super I/O chip integrating multiple device adapters into a single integrated circuit.

In exemplary embodiments, the processing system 700 includes a graphics processing unit 730. Graphics processing unit 730 is a specialized electronic circuit designed to manipulate and alter memory to accelerate the creation of images in a frame buffer intended for output to a display. In general, graphics processing unit 730 is very efficient at manipulating computer graphics and image processing, and has a highly parallel structure that makes it more effective than general-purpose CPUs for algorithms where processing of large blocks of data is done in parallel.

Thus, as configured in FIG. 7, the system 700 includes processing capability in the form of processors 701, storage capability including system memory 714 and mass storage 704, input means such as keyboard 709 and mouse 710, and output capability including speaker 711 and display 715. In one embodiment, a portion of system memory 714 and mass storage 704 collectively store an operating system to coordinate the functions of the various components shown in FIG. 7.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for operating a high-speed deserializer, the method comprising:
   receiving, at a slip pulse-controlled clock generation circuit, a clock slip signal to enable operation of the slip pulse generation circuit;
   generating a slip pulse signal using the slip pulse-controlled clock generation circuit, wherein the slip pulse signal is programmable to slip one or more bits of a serial input data with the number of bits of the serial input data slipped is correlated to a pulse width of the generated slip pulse signal;
   generating a plurality of deserialization clocks for sampling the serial input data using the slip pulse-controlled clock generation circuit, wherein the plurality of deserialization clocks are generated simultaneously with each other; and
   providing the plurality of deserialization clocks to the deserializer to selectively sample the serial input data.

2. The method of claim 1, further comprising receiving, at the slip pulse-controlled clock generation circuit, a user input to programmably select a number of bits to slip.

3. The method of claim 1, wherein each of the plurality of deserialization clocks are delayed by an extended pulse width, wherein the extended pulse width is the same for each of the plurality of deserialization clocks, wherein the deserialization clocks comprise a ½ wave clock, a ¼ wave clock, and a ⅛ wave clock.

4. The method of claim 3, wherein the extended clock width of the plurality of deserialization clocks is based at least in part on a user input.

5. The method of claim 1, further comprising receiving, at the slip pulse-controlled clock generation circuit, a clock slip signal to enable the generation of the slip pulse signal at a first clock cycle; and
   providing the plurality of deserialization clocks to the deserializer in a next cycle to selectively sample the serial input data.

6. The method of claim 1, further comprising synchronizing slipping one or more bits of an output word frame by timing the slip pulse signal with the plurality of deserialization clocks.

7. The method of claim 1, further comprising generating the slip pulse signal to shift a half or a whole input data cycle earlier in a subsequent cycle.

8. A slip pulse generation circuit configured to receive a clock slip signal to enable operation of the slip pulse-controlled clock generation circuit, and generate a slip pulse signal using the slip pulse-controlled clock generation circuit, wherein the slip pulse generation circuit receives a user input to programmably select a number of bits to slip, and wherein the slip pulse signal is programmable to slip one or more bits of a serial input data;
- a deserialization clock circuit configured to generate a plurality of deserialization clocks for sampling the serial input data using the slip pulse-controlled clock generation circuit, wherein the plurality of deserialization clocks are generated simultaneously with each other; and
- a deserializer for sampling the serial input data according to the plurality of deserialization clocks.

9. The system of claim 8, wherein each of the plurality of deserialization clocks are delayed by an extended pulse width, wherein the extended pulse width is the same for each of the plurality of deserialization clocks, wherein the deserialization clocks comprise a ½ wave clock, a ¼ wave clock, and a ⅛ wave clock.

10. The system of claim 9, wherein the extended pulse width of the plurality of deserialization clocks is based at least in part on a user input.

11. The system of claim 8, further comprising receiving, at the slip pulse-controlled clock generation circuit, a clock slip signal to enable the generation of the slip pulse signal at a first clock cycle; and
- providing the plurality of deserialization clocks to the deserializer in a next cycle to selectively sample the serial input data.

12. The system of claim 8, wherein the slip pulse-controlled clock generation circuit is configured to synchronize slipping one or more bits of an output word frame by timing the slip pulse signal with the plurality of deserialization clocks.

13. The system of claim 8, wherein the slip pulse-controlled clock generation circuit is configured to generate the slip pulse signal to shift a half or a whole input data cycle earlier in a subsequent cycle.

14. A computer program product comprising a computer readable storage medium having program instructions embodied therewith, the program instructions executable by a processor to cause the processor to perform operations comprising:
- receiving a clock slip signal to enable operation of a slip pulse-controlled clock generation circuit;
- receive a user input to programmably select a number of bits to slip;
- generating a slip pulse signal, wherein the slip pulse signal is programmable to slip one or more bits of serial input data;
- generating a plurality of deserialization clocks for sampling the serial input data, wherein the plurality of deserialization clocks are generated simultaneously with each other; and
- sampling the serial input data using the plurality of deserialization clocks.

15. The computer program product of claim 14, wherein each of the plurality of deserialization clocks are delayed by an extended pulse width, wherein the extended pulse width is the same for each of the plurality of deserialization clocks, wherein the deserialization clocks comprise a ½ wave clock, a ¼ wave clock, and a ⅛ wave clock.

16. The computer program product of claim 14, wherein the extended pulse width of the plurality of deserialization clocks is based at least in part on a user input.

17. The computer program product of claim 14, wherein the instructions are further executable by a processor to cause the processor to receive a clock slip signal to enable the generation of the slip pulse signal at a first clock cycle; and
- provide the plurality of deserialization clocks to the deserializer in a next cycle to selectively sample the serial input data.

18. The computer program product of claim 14, wherein the instructions are further executable by a processor to cause the processor to generate the slip pulse signal to shift a half or a whole input data cycle earlier in a subsequent cycle.

* * * * *